US012696792B2

(12) United States Patent
Wang et al.

(10) Patent No.: US 12,696,792 B2
(45) Date of Patent: Jul. 28, 2026

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Xin Zhi Wang, Kaohsiung City (TW); Chuan-Ping Hou, Tainan Country (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 539 days.

(21) Appl. No.: 17/743,451

(22) Filed: May 13, 2022

(65) Prior Publication Data

US 2023/0369155 A1     Nov. 16, 2023

(51) Int. Cl.
| | |
|---|---|
| *H10W 74/10* | (2026.01) |
| *H10D 64/01* | (2025.01) |
| *H10D 84/01* | (2025.01) |
| *H10D 84/03* | (2025.01) |
| *H10D 84/85* | (2025.01) |
| *H10P 14/69* | (2026.01) |
| *H10P 14/694* | (2026.01) |
| *H10W 74/43* | (2026.01) |

(52) U.S. Cl.
CPC .... *H10W 74/131* (2026.01); *H10D 64/01318* (2026.01); *H10D 64/017* (2025.01); *H10D 84/0177* (2025.01); *H10D 84/038* (2025.01); *H10D 84/85* (2025.01); *H10P 14/6905* (2026.01); *H10P 14/69433* (2026.01); *H10W 74/43* (2026.01)

(58) Field of Classification Search
CPC ......... H01L 29/66545; H01L 29/78696; H01L 29/42392; H01L 29/66795; H01L 29/0673
See application file for complete search history.

(56) References Cited

U.S. PATENT DOCUMENTS

| | | | | |
|---|---|---|---|---|
| 2016/0336421 A1* | 11/2016 | Cheng | ................. | H01L 27/1211 |
| 2016/0372576 A1* | 12/2016 | Cai | ................... | H01L 29/66545 |
| 2017/0186650 A1* | 6/2017 | Shen | ................... | H01L 21/3212 |
| 2019/0103491 A1* | 4/2019 | Chan | ................. | H01L 21/31133 |

* cited by examiner

*Primary Examiner* — Tony Tran
(74) *Attorney, Agent, or Firm* — WPAT LAW; Anthony King

(57) ABSTRACT

A semiconductor structure includes a semiconductor substrate, a metal gate structure disposed over the semiconductor substrate, an ILD structure over the semiconductor substrate and surrounding the metal gate structure, and a protecting layer over the ILD structure. A top surface of the protecting layer is aligned with a top surface of the metal gate structure. The protecting layer is separated from the metal gate structure.

15 Claims, 18 Drawing Sheets

SEMICONDUCTOR STRUCTURE AND METHOD FOR FORMING THE SAME

BACKGROUND

The electronics industry has experienced an ever-increasing demand for smaller and faster electronic devices that are able to support greater numbers of increasingly complex and sophisticated functions. Accordingly, there is a continuing trend in the semiconductor industry to manufacture low-cost, high-performance, low-power integrated circuits (ICs). Thus far these goals have been achieved in large part by scaling down semiconductor IC dimensions (e.g., minimum feature size) and thereby improving production efficiency and reducing associated costs. However, such downscaling has also introduced increased complexity to the semiconductor manufacturing process. Thus, the realization of continued advances in semiconductor ICs and devices requires similar advances in semiconductor manufacturing processes and technology.

As technology nodes achieve progressively smaller scales, in some IC designs, researchers have hoped to replace a typical polysilicon gate with a metal gate to improve device performance by decreasing feature sizes. One approach to forming the metal gate is called a "gate-last" approach, sometimes referred to as a replacement polysilicon gate (RPG) approach. In the RPG approach, the metal gate is fabricated last, which allows for a reduced number of subsequent operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
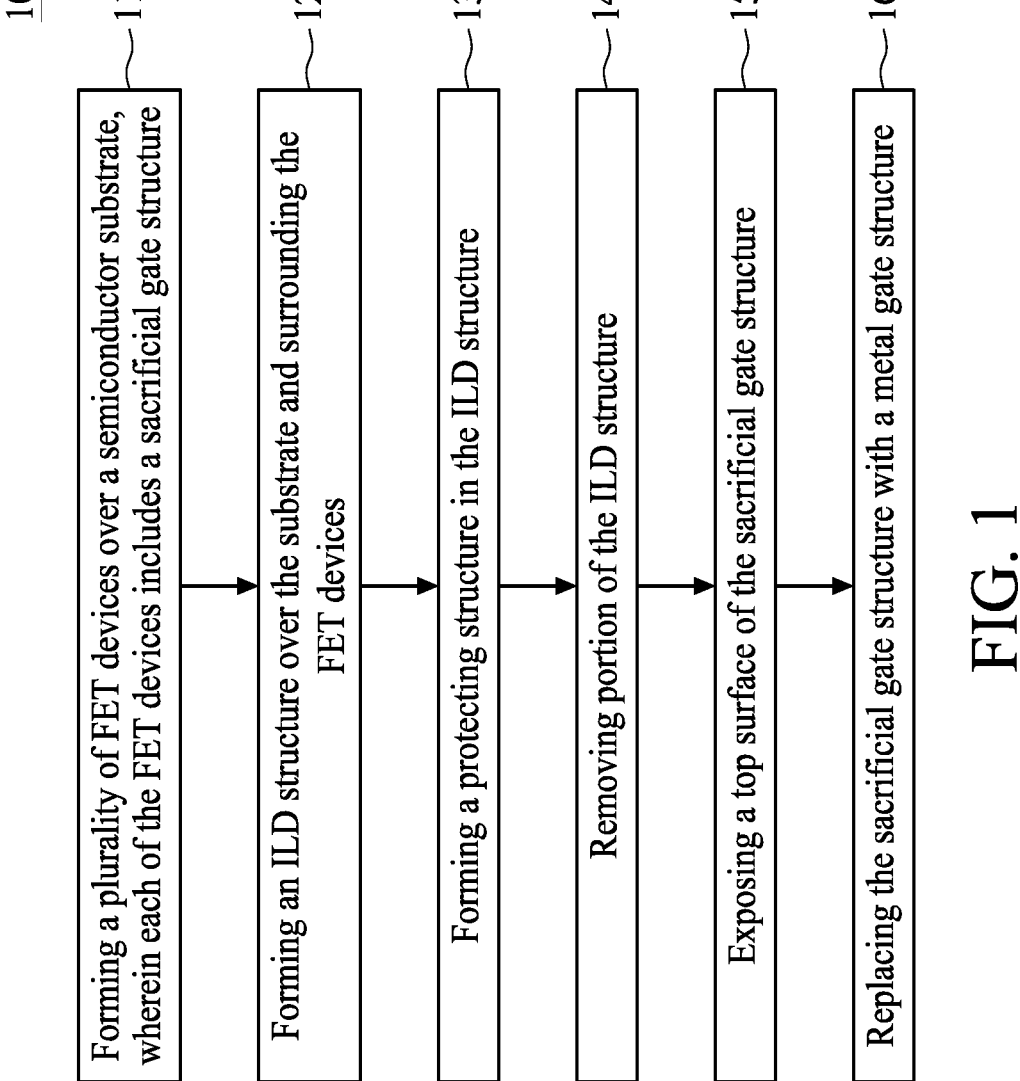
FIG. 1 is a flowchart representing a method for forming a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

As the dimensions of a transistor decrease, the thickness of the gate dielectric layer may be reduced to maintain performance with a decreased gate length. In order to reduce gate leakage, a high dielectric constant (high-k or HK) gate dielectric layer is used to provide a performance comparable to that provided by a typical gate oxide used in larger technology nodes. A high-k metal gate (HKMG) approach including the metal gate electrode and the high-k gate dielectric layer is therefore recognized. However, the HKMG approach is a complicated approach, and many issues arise.

For example, with a high-k metal gate last (HKMG) operation, after operations of forming sacrificial gate structures (sometimes referred to as dummy gate structures), forming elements such as spacers and source/drain stressors, and forming of a dielectric structure to fill spaces between the sacrificial gate structures, a planarization is performed in order to obtain a flat and even surface. In some embodiments, such planarization may be chemical-mechanical polishing (CMP) operation. In some comparative embodiments, it is found that some dielectric structure between the sacrificial gate structures may suffer consumptions, known as the "dishing". After replacing the sacrificial gate structures with metal materials, a planarization is required to remove superfluous metals and obtain a flat and even surface. However, the dishing of the dielectric structure may be filled with metal materials during the replacement of the sacrificial gate structures. Further, the metal in the dishing may not be removed during the planarization. The metals remain in the dielectric structure may cause more defect issue in subsequent operations.

Embodiments of a method for forming a semiconductor structure are therefore provided. The semiconductor structure can be formed in a planar device process according to some embodiments. The semiconductor structure can be formed in a non-planar device in alternative embodiments. In some embodiments, the method for forming the semiconductor structure includes providing a protecting layer over a top surface of the dielectric structure, which fills spaces between the sacrificial gate structures. In other embodiments, the method for forming the semiconductor structure includes providing a doped region in the dielectric structure. The protecting layer and the doped region both help reducing consumption of the dielectric structure. Accordingly, the dishing issue during a planarization required in the HKMG process.

FIG. 1 is a flowchart representing a method for forming a semiconductor structure 10 according to aspects of the present disclosure. The method 10 includes a number of operations (11, 12, 13, 14, 15 and 16). The method 10 will be further described according to one or more embodiments. It should be noted that the operations of the method 10 may be rearranged or otherwise modified within the scope of the various aspects. It should further be noted that additional processes may be provided before, during, and after the method 10, and that some other processes may be only briefly described herein. Thus, other implementations are possible within the scope of the various aspects described herein.

Figure 2:
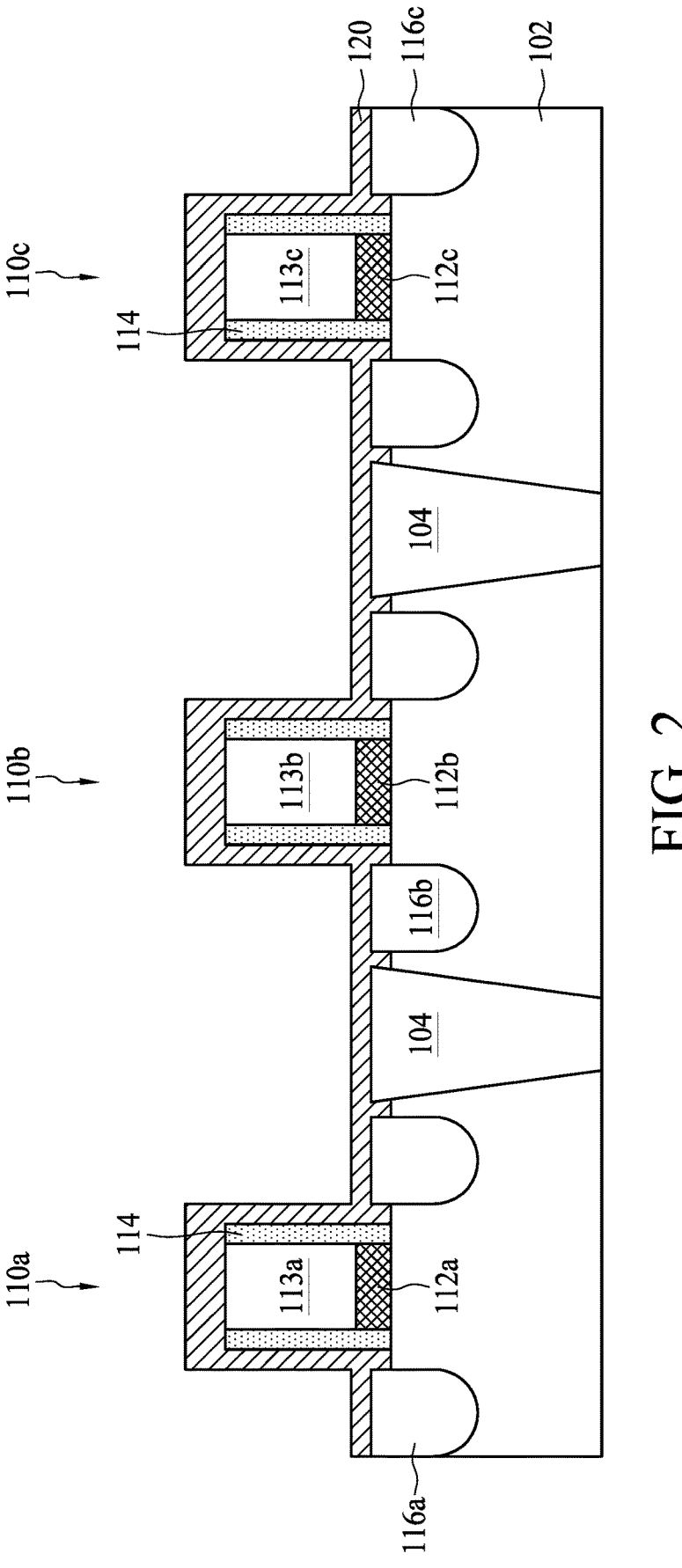
FIGS. 2 to 10 are cross-sectional views illustrating a semiconductor structure at various fabrication stages according to aspects of the present disclosure in one or more embodiments.

FIGS. 2 to 10 are cross-sectional show cross-sectional views illustrating a semiconductor structure at various fabrication stages according to aspects of the present disclosure in one or more embodiments. Referring to FIG. 2, in operation 11, a plurality of field-effect transistor (FET) devices 110a, 110b, 110c are formed over a semiconductor substrate 102. The operation 11 may include further operations. For example, the semiconductor substrate 102 is received. In some embodiments, the semiconductor substrate 102 may be a silicon substrate. The semiconductor substrate 102 may also include other semiconductors such as germanium (Ge), silicon carbide (SiC), silicon germanium (SiGe), or diamond. Alternatively, the semiconductor substrate 102 may include a compound semiconductor and/or an alloy semiconductor. The semiconductor substrate 100 may include various doping configurations depending on design requirements, as is known in the art. For example, different doping profiles (e.g., n wells or p wells) may be formed in the substrate semiconductor 102 in regions designed for different device types (e.g., n-type field-effect transistors (NFET) (i.e. the FET device 110a), or p-type field-effect transistors (PFET) (i.e., the FET device 110b)). Further, different doping profiles may be formed in the substrate semiconductor 102 in regions designed for different operation voltage (e.g., core device) (i.e., the FET devices 110a and 110b) and the high-voltage device (i.e., the FET device 110c). In some embodiments, the FET devices 110a, 110b and/or 110c may be planar transistors or multi-gate transistors, such as fin-like FETs (FinFETs).

The semiconductor substrate 102 may include isolation structures, e.g., shallow trench isolation (STI) structures 104 defining and interposing regions for accommodating devices as mentioned above. In some embodiments, according to different Vt requirements, the isolation structures 104 may have a greater depth for HV device, and smaller depth for LV/core devices, though not shown.

In some embodiments, a dielectric layer and a semiconductor layer are sequentially formed semiconductor substrate 102. The semiconductor layer may be made of polysilicon, but the disclosure is not limited thereto. A patterning operation using a pattered photoresist and a patterned hard mask is then performed on the semiconductor layer and the dielectric layer. Thus patterned dielectric layers 112a, 112b and 112c, and sacrificial gate structures 113a, 113b and 113c are formed over the semiconductor substrate 102. As shown in FIG. 2, the patterned dielectric layer 112a is between the sacrificial gate structure 113a and the semiconductor substrate 102, the patterned dielectric layer 112b is between the sacrificial gate structure 113b and the semiconductor substrate 102, and the patterned dielectric layer 112c is between the sacrificial gate structure 113c and the semiconductor substrate 102.

In some embodiments, spacers 114 are formed over sidewalls of the sacrificial gate structures 113a, 113b and 113c. In some embodiments, the spacers 114 are made of silicon nitride (SiN), silicon carbide (SiC), SiO, silicon oxynitride (SiON), silicon carbon or any suitable material, but the disclosure is not limited thereto. In some embodiments, the spacers 114 are formed by deposition and etching back operations.

Still referring to FIG. 2, in some embodiments, a source/drain 116a, 116b and 116c are formed at opposite sides of the sacrificial gate structures 113a, 113b, and 113c. In some embodiments, tops of the sources/drains 116a, 116b and 116c may be higher than a top surface of the semiconductor substrate 102. In such embodiments, the sources/drains 116a, 116b and 116c may be formed by forming recesses in the semiconductor substrate 102 and growing a strained material in the recesses by an epitaxial (epi) process. In addition, a lattice constant of the strained material may be different from a lattice constant of the semiconductor substrate 102. Accordingly, the sources/drains 116a, 116b and 116c may serve as stressors that improve carrier mobility. In some embodiments, Ge, SiGe, InAs, InGaAs, InSb, GaSb, InAlP, InP, SiP, or a combination thereof, can be used to form the sources/drains, depending on types of the FET device. For example, SiGe may be used to form the sources/drains 116b and 116c of the PFET device 110b and 110c, while SiP is used to form the source/drain 116a of the NFET device 110a. Further, dopant concentrations of the sources/drains 116a, 116b and 116c may be different depending on different device requirements.

Accordingly, the FET devices 110a, 110b and 110c are formed over the semiconductor substrate 102. Further, each of the FET devices 110a, 110b and 110c includes the sacrificial gate structures 113a, 113b and 113c.

In some embodiments, a contact etch stop layer (CESL) 120 may be formed over the semiconductor the substrate 102 to cover the FET devices 110a, 110b and 110c. In some embodiments, the CESL 120 can include silicon nitride, silicon oxynitride, and/or other applicable materials.

Figure 3:
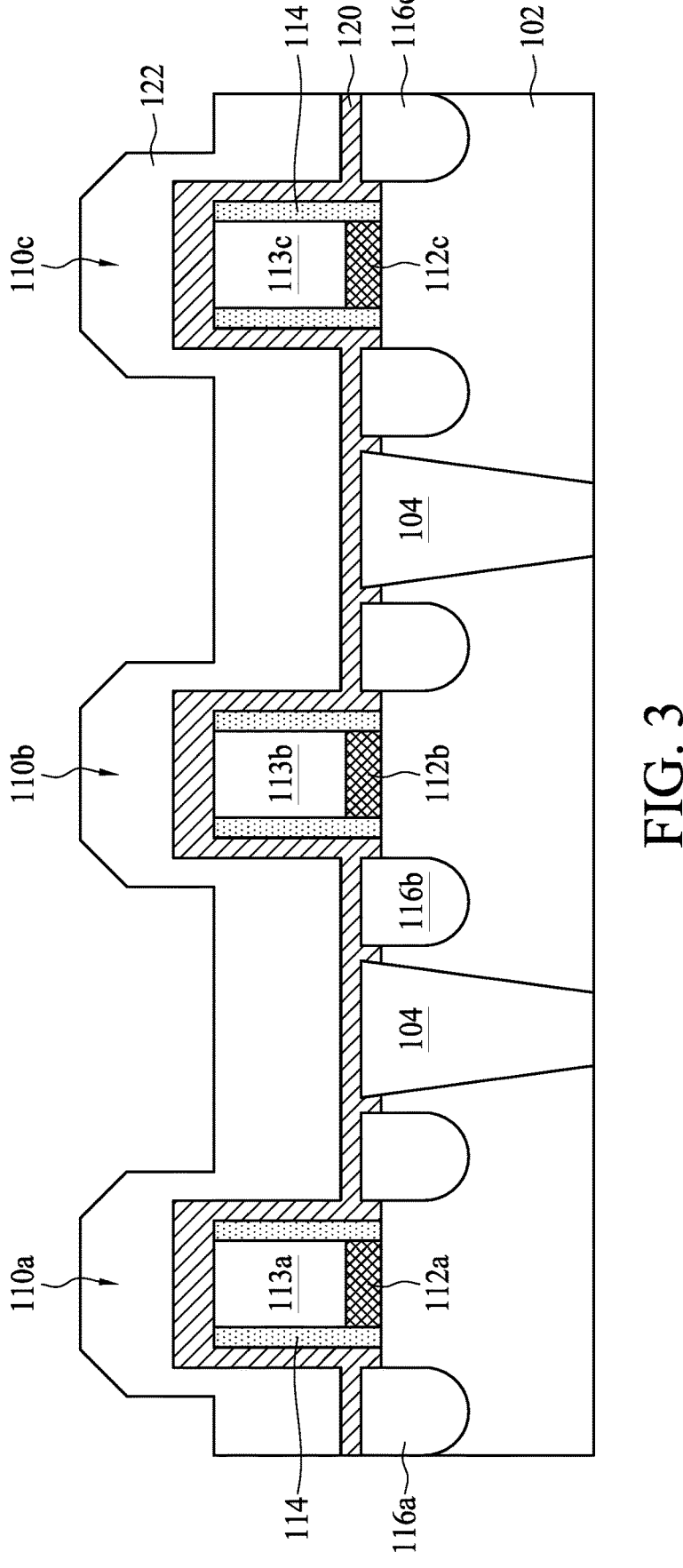

Referring to FIG. 3, in operation 12, an inter-layer (ILD) structure is formed; and in operation 13, a protecting structure is formed in the ILD structure. In some embodiments, operations 12 and 13 may include further operations. For example, a first ILD layer 122 may be formed over the semiconductor substrate 102. The first ILD layer 122 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon-doped silicon oxide, amorphous fluorinated carbon, parylene, bis-benzocyclobutenes (BCB), and polyimide. The first ILD layer 122 may be in contact with the CESL 120, but the disclosure is not limited thereto. Further, as shown in FIG. 3, spaces between the FET devices 110a, 110b and 110c are filled with the ILD structure (i.e., the first ILD layer 122.) In other words, the first ILD layer 122 surrounds the FET devices 110a, 110b and 110c. In should be noted that portions of the first ILD layer 122 may protrude due to heights of the sacrificial gate structures 113a, 113b and 113c. Thus, in some embodiments, top surfaces of the portions of the first ILD layer 122 over the sacrificial gate structures 113a, 113b and 113c are higher than top surfaces of other portions of the first ILD layer 122 that are between the sacrificial gate structures 113a, 113b and 113c.

Figure 4:
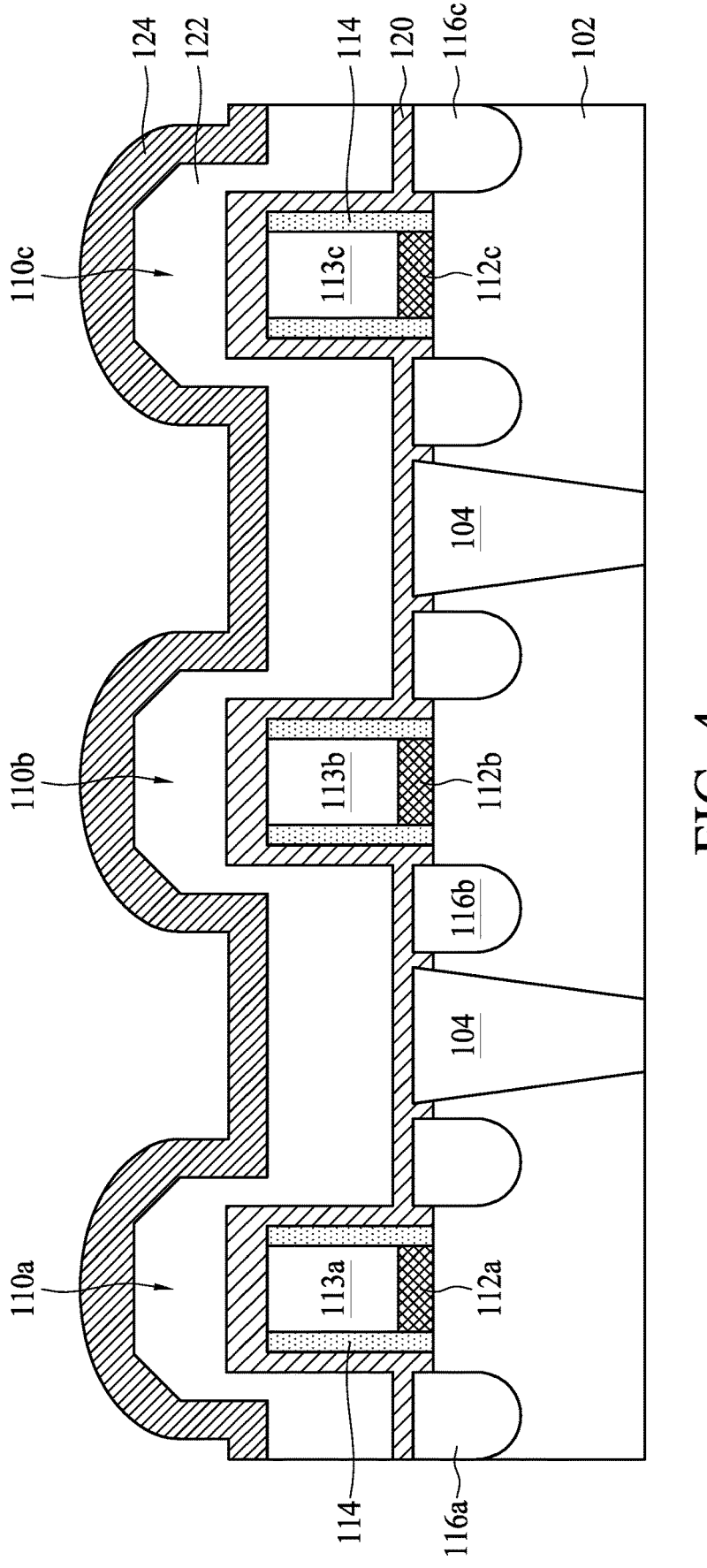

Referring to FIG. 4, in operation 13, the protecting structure is formed. In some embodiments, the protecting structure includes a protecting layer 124. In some embodiments, the protecting layer 124 include a silicon nitride layer or a silicon carbide layer, but the disclosure is not limited thereto. The protecting layer 124 may be conformally formed over the first ILD layer 122, as shown in FIG. 4, but the disclosure is not limited thereto. In some embodiments, a thickness of the protecting layer 124 may be equal to or greater than a thickness of the CESL 120. For example, the thickness of the protecting layer 124 may between approximately 200 nanometers and approximately 400 nanometers, but the disclosure is not limited thereto.

Figure 5:
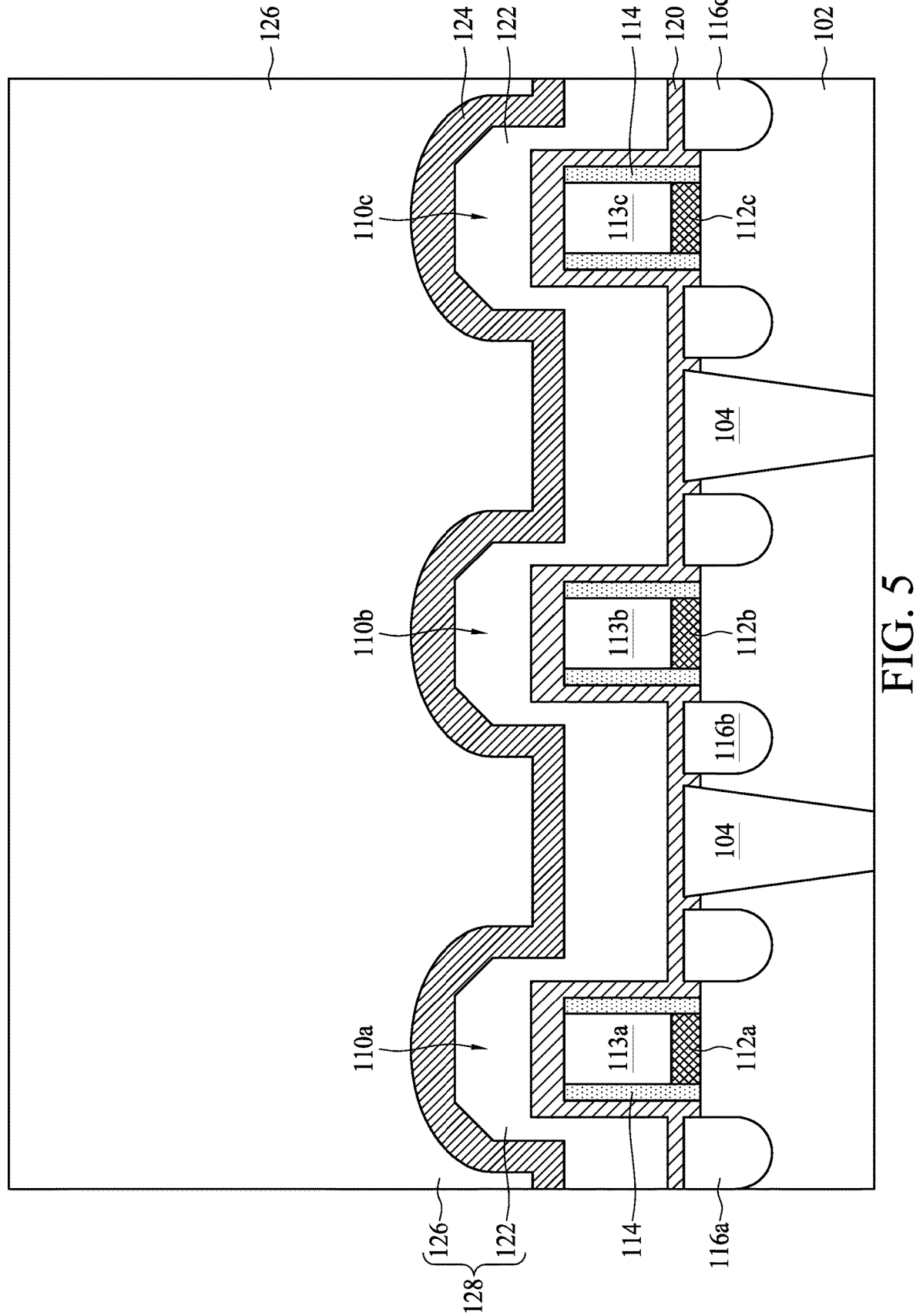

Referring to FIG. 5, in some embodiments, operation 12 further includes forming a second ILD layer 126 over the protecting structure (i.e., the protecting layer 124). The second ILD layer 126 and the first ILD layer 122 form the ILD structure 128. In other words, the protecting layer 124 is sandwiched between the first ILD layer 122 and the second ILD layer 126. In some embodiments, the first ILD layer 122 and the second ILD layer 126 may include a same insulating material, but the disclosure is not limited thereto. In some embodiments, a thickness of the second ILD layer 126 is greater than a thickness of the first ILD layer 122. In some embodiments, the second ILD layer 126 is thick enough to provide a substantially even surface over the semiconductor substrate 102, as shown in FIG. 5.

Figure 6:
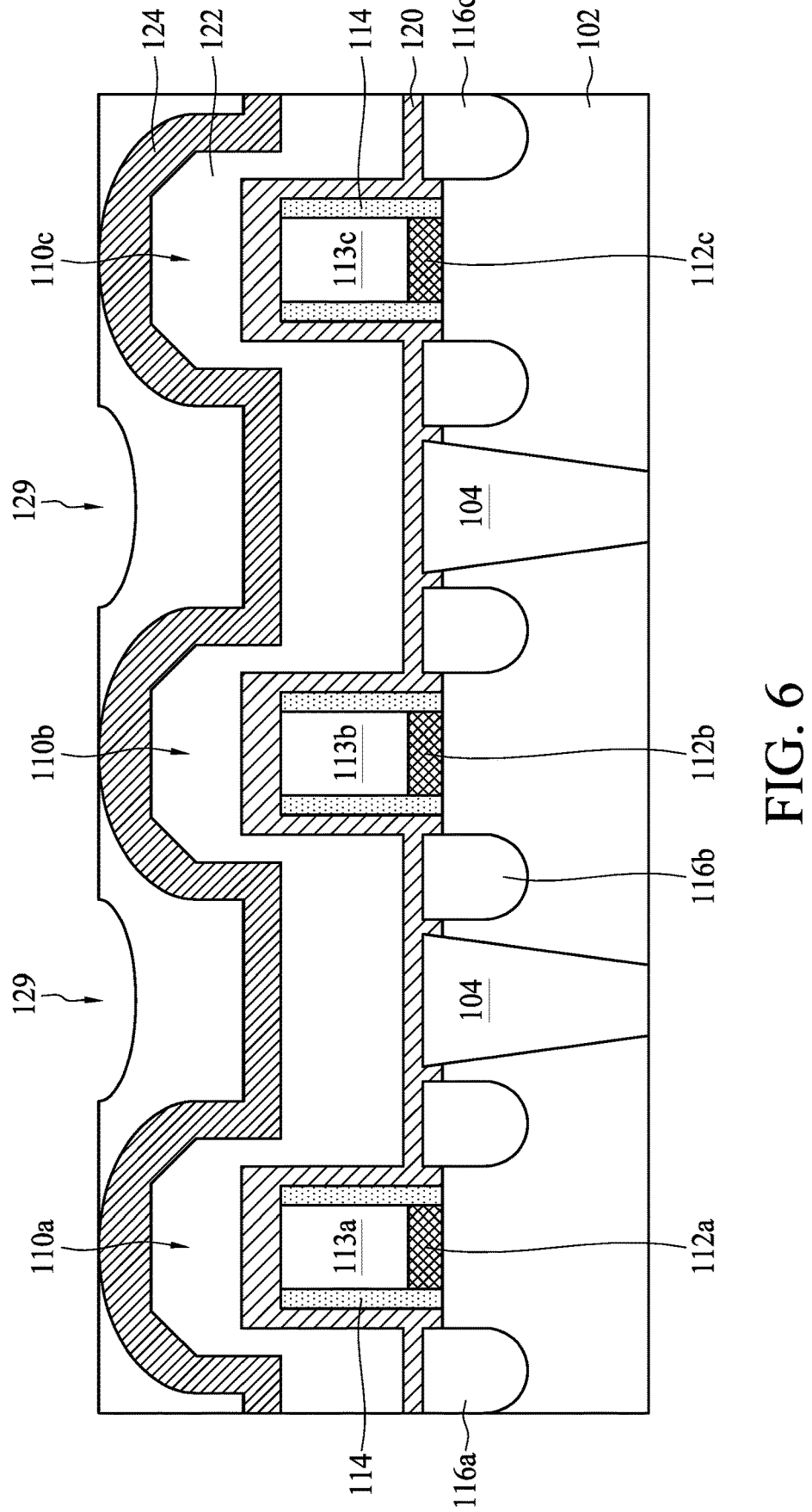

Referring to FIG. 6, in operation 14, a portion of the ILD structure 128 is removed. In some embodiments, operation 14 includes further operations. For example, a planarization is performed on the ILD structure 128. In some embodiments, the planarization is a CMP operation. In some embodiments, the CMP operation is performed on the second ILD layer 126. A portion of the second ILD layer 126 of the ILD structure 128 is removed until portions of the protecting layer 124 over the sacrificial gate structures 113a, 113b and 113c are exposed. It should be noted that dishing issues may occurs in the CMP operation, therefore recesses 129 may be formed in the second ILD layer 126 between the sacrificial gate structures 113a, 113b and 113c.

Figure 7:
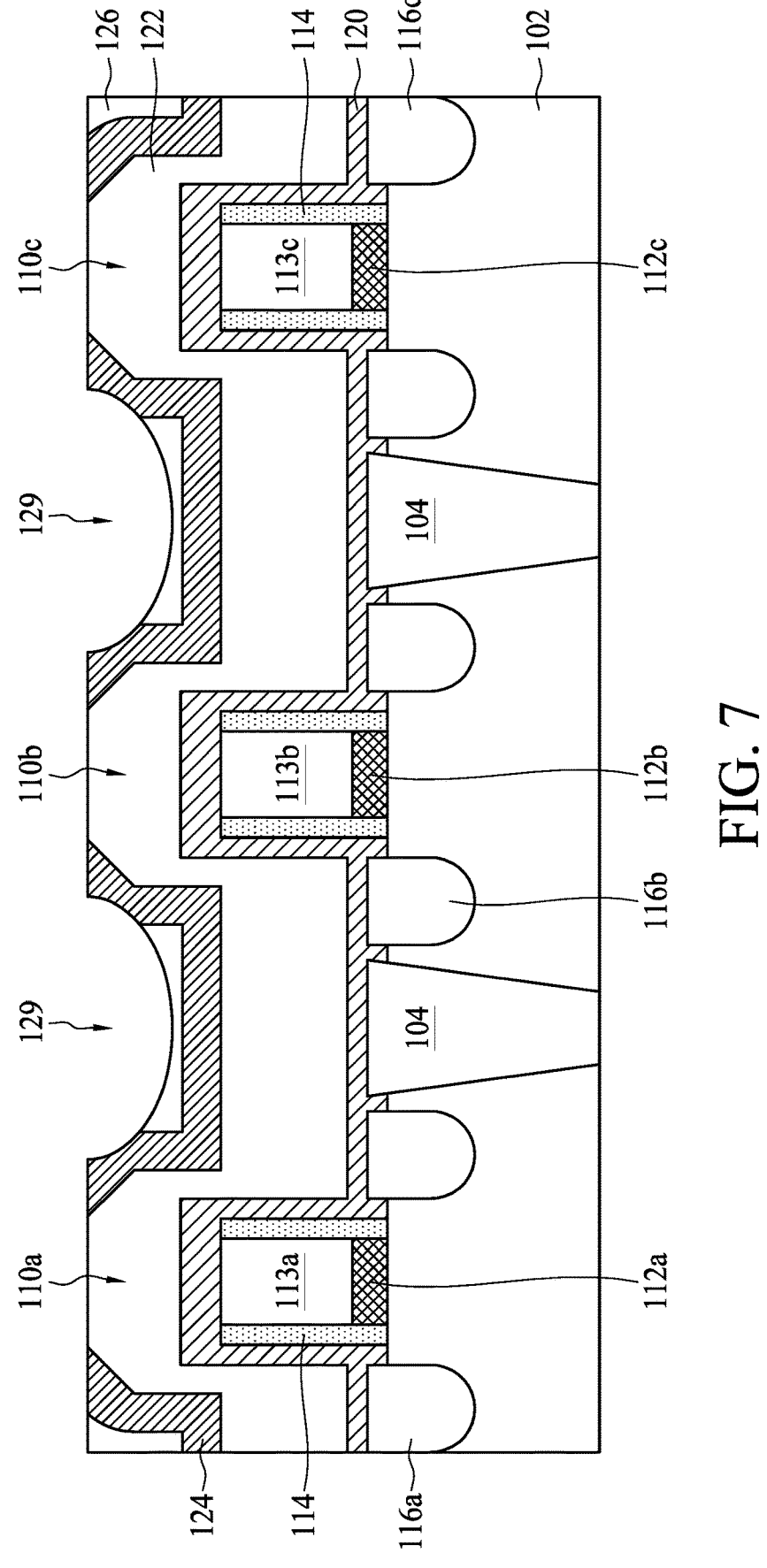

Referring to FIG. 7, the CMP operation may be continuously performed on the exposed protecting layer 124 until the portions of the first ILD layer 122 over the sacrificial gate structures 113a, 113b and 113c are exposed. In such embodiments, the dishing issue may still occurs over the portions of the ILD structure 128 between the sacrificial gate structures 113a, 113b and 113c. In some embodiments, the recesses 129 may be deepened.

Figure 8A:
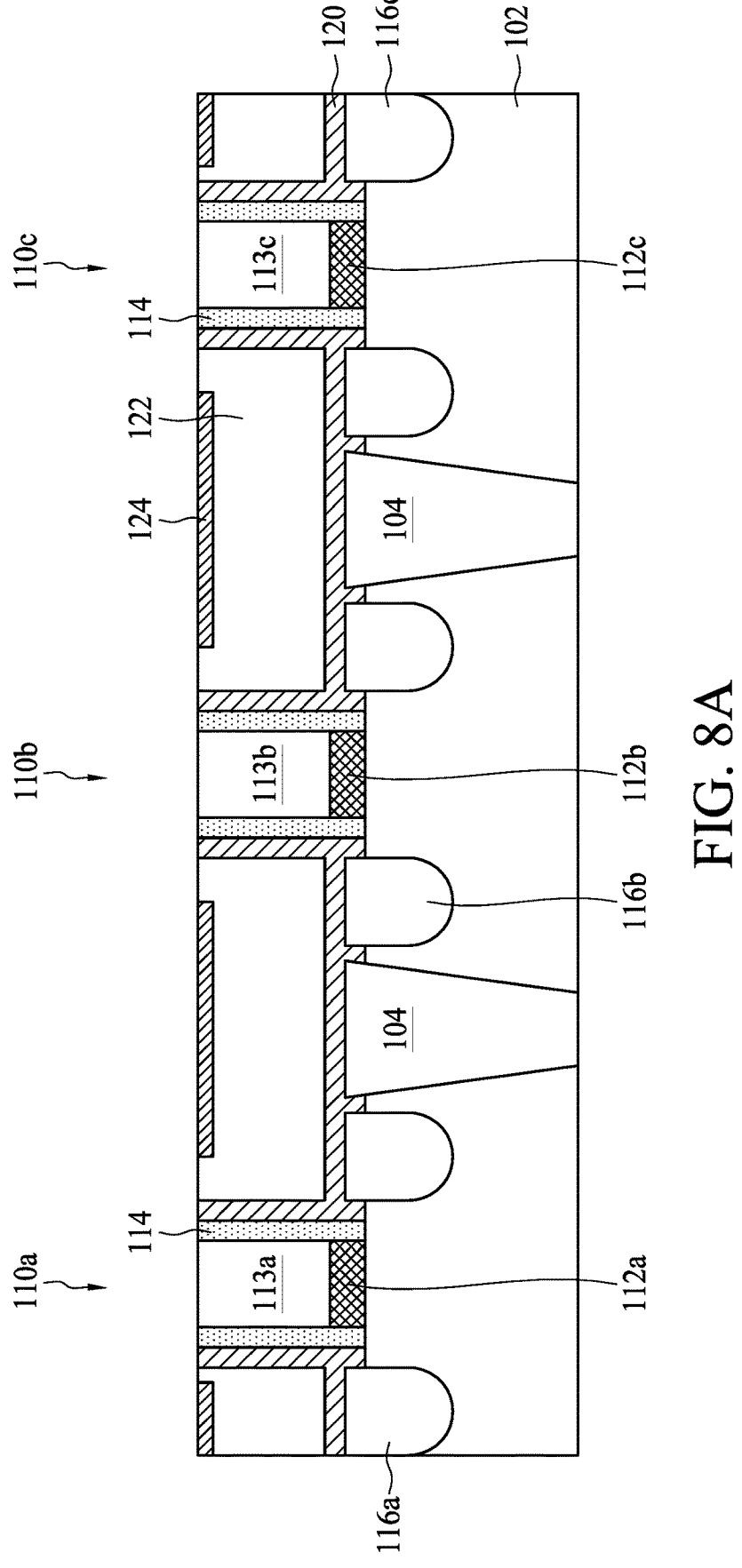
Figure 8B:
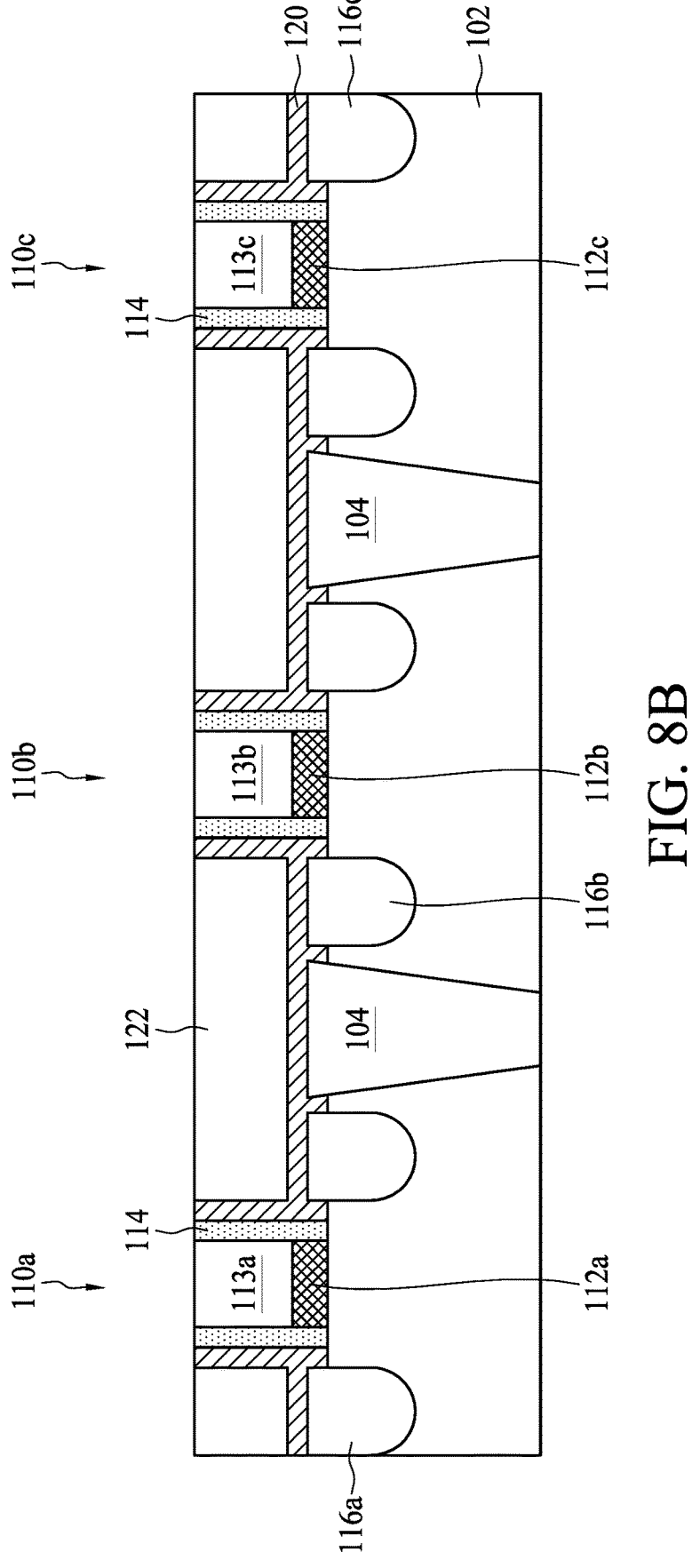

Referring to FIGS. 8A and 8B, in operation 15 top surfaces of the sacrificial gate structures 113a, 113b and 113c are exposed. In some embodiments, the CMP operation may continuously performed on the exposed first ILD layer 122 (and the hard mask) until top surfaces of the sacrificial gate structures 113a, 113b and 113c are exposed. In some embodiments, the protecting layer 124 helps protect portions of the first ILD layer 122 between sacrificial gate structures 113a, 113b and 113c. Therefore, portions of the protecting layer 124 may be removed in the CMP operation. In some embodiments, other portions of the protecting layer 124 be left over the first ILD layer 122 between the sacrificial gate structures 113a, 113b and 113c. Further, top surfaces of the remaining protecting layer 124, top surfaces of the remaining first ILD layer 122 and the top surfaces of the sacrificial gate structures 113a, 113b and 113c may be aligned with each other. In other words, a substantially even and flat surfaces is obtained, as shown in FIG. 8A.

In some alternative embodiments, the protecting layer 124 may be entirely removed in the CMP operation. Therefore, portions of the first ILD layer 122 between the sacrificial gate structures 113a, 113b and 113c are exposed. Further, top surfaces of the remaining first ILD layer 122 and the top surfaces of the sacrificial gate structures 113a, 113b and 113c may be aligned with each other. In other words, a substantially even and flat surfaces is obtained, as shown in FIG. 8B.

Figure 9:
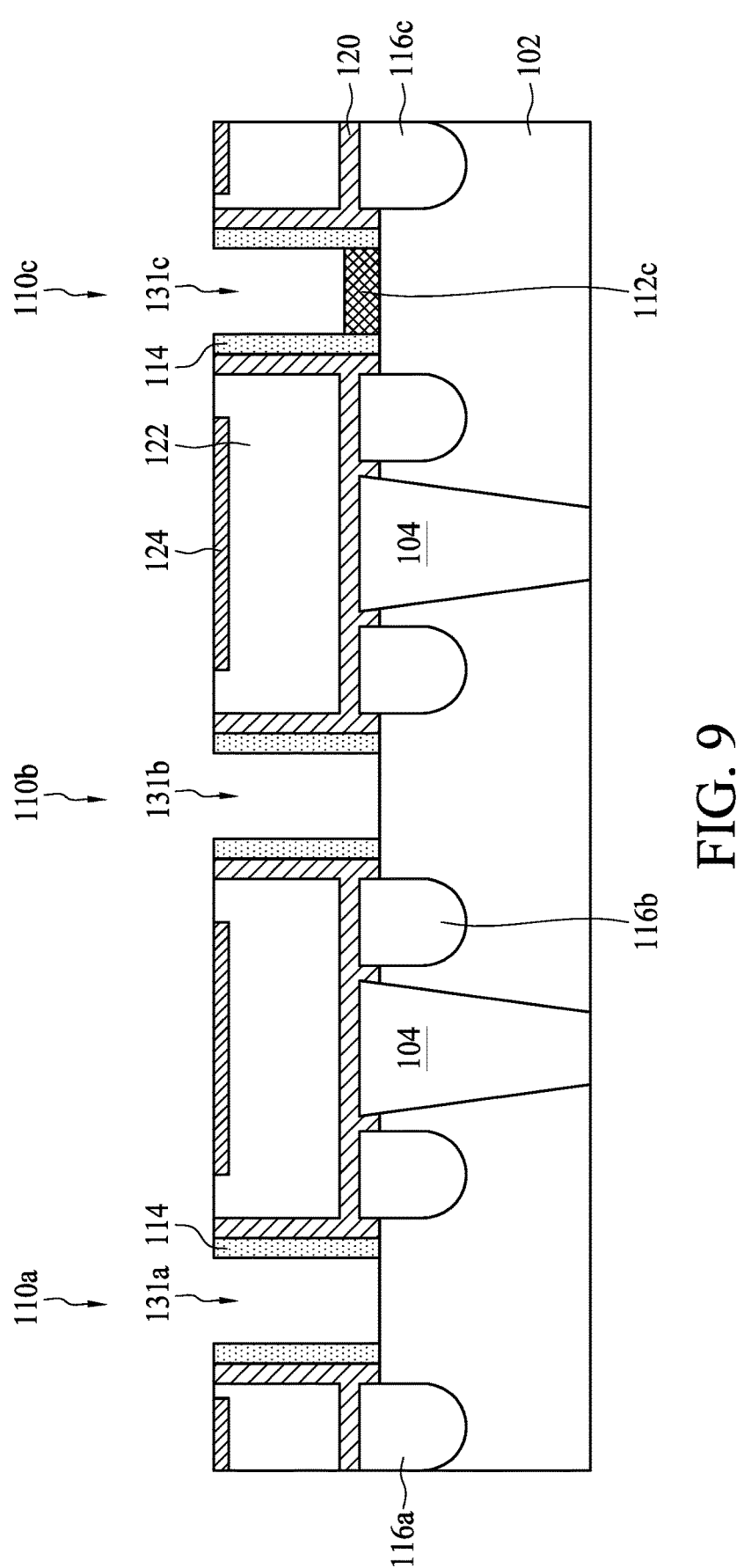

In operation 16, the sacrificial gate structures 113a, 113b and 113c are replaced with metal gate structures. In some embodiments, operation 16 includes further operations. For example, the sacrificial gate structures 113a, 113b and 113c are removed. Accordingly, a plurality of gate trenches 131a, 131b and 131c are formed as shown in FIG. 9, which is a cross-sectional view of the semiconductor structure in a stage subsequent to FIGS. 8A and 8B.

In some embodiments, the dielectric layers 112a and 112b of the FET devices 110a and 110b, which may be a part of a core circuit, are removed, thus the semiconductor substrate 102 may be exposed through bottoms of the gate trenches 131a and 131b. In some embodiments, the dielectric layer 112c of the FET device 110c, which may a HV device, remains, thus the dielectric layer 112c is exposed through a bottom of the gate trench 131c.

In some embodiments, in operation 16, a high-k dielectric layer is formed. The high-k dielectric layer is formed to cover bottoms and sidewalls of the gate trenches 131a, 131b and 131c. In some embodiments, another dielectric layer serving as an interfacial layer (IL) 132a and 132b may be formed in the bottoms of the gate trenches 131a and 131b before the forming of the high-k dielectric layer. Thus the high-k dielectric layer is formed over the IL 132a in the gate trench 131a, over the IL 132b in the gate trench, and over the dielectric layer 112c in the gate trench 131c. In some embodiments, the high-k dielectric layer 134 includes a high-k dielectric material having a high dielectric constant, for example, a dielectric constant greater than that of thermal silicon oxide (3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfO_xN_y$), other suitable metal-oxides, or combinations thereof.

In some embodiments, in operation 16, a work function metal layer 136a is formed in the gate trench 131a, a work function metal layer 136b is formed in the gate trench 131b, and a work function metal layer 136c is formed in the gate trench 131c. In some embodiments, the work function metal layer 136a include n-type work function metal, while the work function meal layers 136b and 136c include p-type work function metals, depending on the product requirements. In some embodiments, the work function metal layers 136a, 136b and 136c may include a single layer. In some alternative embodiments, the work function metal layers 136a, 136b and 136c may include a multilayered structure.

Figure 10:
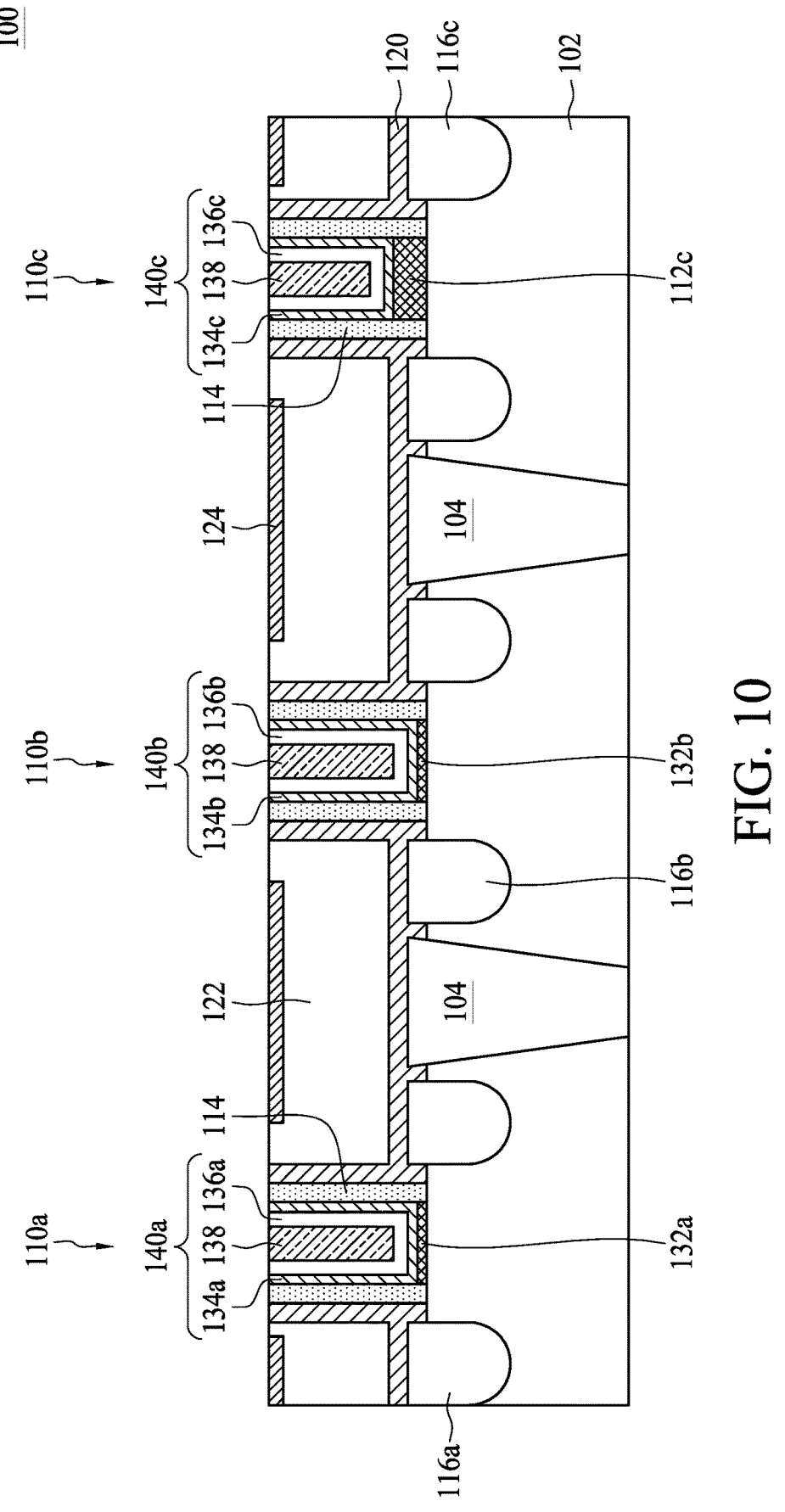

In operation 16, a gap-filling metal layer 138 is formed to fill the gate trenches 131a, 131b and 131c. In some embodiments, the gap-filling metal layer 138 can include conductive material such as Al, Cu, AlCu, or W, but is not limited to such materials. A planarization operation such as a CMP operation may be performed to remove superfluous metal layers. Thus, metal gate structures 140a, 140b and 140c are formed. As shown in FIG. 10, the metal gate structure 140a includes the high-k dielectric layer 134a, the work function metal layer 136a and the gap-filling metal layer 138. The metal gate structure 140b includes the high-k dielectric layer 134b, the work function metal layer 136b and the gap-filling metal layer 138. The metal gate structure 140c includes the high-k dielectric layer 134c, the work function metal layer 136c and the gap-filling metal layer 138.

Accordingly, a semiconductor structure 100 is obtained as shown in FIG. 10. The semiconductor structure 100 includes the semiconductor substrate 102 and the FET devices 110a, 110b and 110c disposed over the semiconductor substrate 102. The FET device 110a includes the metal gate structure 140a, the spacer 114 and the source/drain 116a. The FET device 110b includes the metal gate structure 140b, the spacer 114 and the source/drain 116b. The FET device 110c includes the metal gate structure 140c, the spacer 114 and the source/drain 116c. The semiconductor structure 100 further includes an ILD structure (i.e., the first ILD layer 122) over the semiconductor substrate 102 and surrounding the metal gate structures 140a, 140b and 140c. Further, the semiconductor structure 100 includes the protecting layer 124 over the ILD structure. As shown in FIG. 10, a top surface of the protecting layer 124 is aligned with top surfaces of the metal gate structures 140a, 140b and 140c.

The protecting structure (i.e., the protecting layer 124) helps mitigate the dishing issue occurred in the CMP operation. Thus, the yield of the CMP operation is improved.

In some embodiments, the method 10 may be performed to form the semiconductor structure 150. The method 10 may be performed to form another semiconductor structure as described below.

Figure 11:
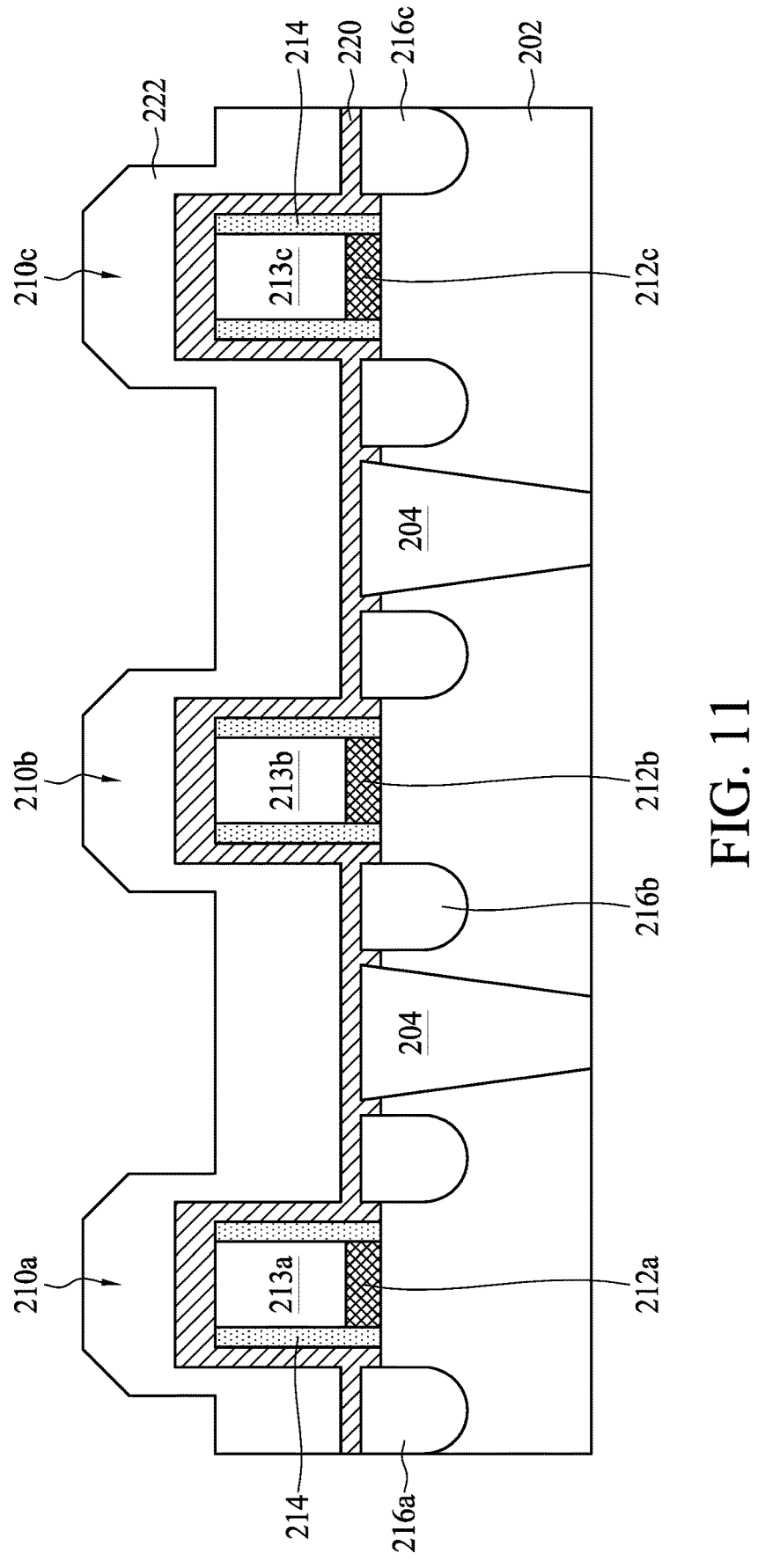
FIGS. 11 to 16 are cross-sectional views illustrating a semiconductor structure at various fabrication stages according to aspects of the present disclosure in one or more embodiments.

FIGS. 11 to 16 are cross-sectional views illustrating a semiconductor structure at various fabrication stages according to aspects of the present disclosure in one or more embodiments. It should be noted that same elements in FIGS. 2 to 16 may include same materials. Referring to FIG. 11, a plurality of field-effect transistor (FET) devices 210a, 210b, 210c are formed over a semiconductor substrate 202. The operation 11 may include further operations. For example, in operation 11, the semiconductor substrate 202 is received. As mentioned above, the semiconductor substrate 202 may include various doping configurations depending on design requirements, as is known in the art. For example, different doping profiles (e.g., n wells or p wells) may be formed in the substrate semiconductor 202 in regions designed for different device types (e.g., NFET (i.e. the FET device 210a), or PFET (i.e., the FET device 210b)). Further, different doping profiles may be formed in the substrate semiconductor 202 in regions designed for different operation voltage (e.g., core device) (i.e., the FET devices 210a and 210b) and the HV device (i.e., the FET device 210c). In some embodiments, the FET devices 210a, 210b and/or 210c may be planar transistors or multi-gate transistors, such as FinFETs.

As mentioned above, the semiconductor substrate 202 may include isolation structures, e.g., STI structures 204 defining and interposing regions for accommodating devices as mentioned above. In some embodiments, according to different Vt requirements, the isolation structures 204 may have a greater depth for HV device, and smaller depth for LV/core devices, though not shown.

In operation 11, a dielectric layer and a semiconductor layer are sequentially formed semiconductor substrate 202. The semiconductor layer may be made of polysilicon, but the disclosure is not limited thereto. A patterning operation using a pattered photoresist and a patterned hard mask is then performed on the semiconductor layer and the dielectric layer. Thus patterned dielectric layers 212a. 212b and 212c, and sacrificial gate structures 213a, 213b and 213c are formed over the semiconductor substrate 202, as shown in FIG. 11. In operation 11, spacers 214 are formed over sidewalls of the sacrificial gate structures 213a, 213b and 213c. In some embodiments, a sources/drains 216a, 216b and 216c are formed at opposite sides of the sacrificial gate structures 213a, 213b, and 213c. In some embodiments, tops of the sources/drains 216a, 216b and 216c may be higher than a top surface of the semiconductor substrate 202. In such embodiments, the sources/drains 216a, 216b and 216c may be formed by forming recesses in the semiconductor substrate 202 and growing a strained material in the recesses by an epitaxial (epi) process. In addition, a lattice constant of the strained material may be different from a lattice constant of the semiconductor substrate 202. Accordingly, the sources/drains 216a, 216b and 216c may serve as stressors that improve carrier mobility. Further, dopant concentrations of the sources/drains 216a, 216b and 216c may be different depending on different device requirements.

Accordingly, the FET devices 210a, 210b and 210c are formed over the semiconductor substrate 202. Further, each of the FET devices 210a, 210b and 210c includes the sacrificial gate structures 213a, 213b and 213c.

In some embodiments, a CESL 220 may be formed to cover the FET devices 210a, 210b and 210c over the semiconductor the substrate 202.

In operation 12, an ILD structure 222 is formed. In some embodiments, operations 12 and 13 may include further operations. The ILD structure 222 may be in contact with the CESL 220, but the disclosure is not limited thereto. Further, as shown in FIG. 11, spaces between the FET devices 210a, 210b and 210c are filled with the ILD structure 222. In other words, the ILD structure 222 surrounds the FET devices 210a, 210b and 210c. In should be noted that portions of the ILD structure 222 may protrude due to heights of the sacrificial gate structures 213a, 213b and 213c. Thus, in some embodiments, top surfaces of the portion of the ILD structure 222 over the sacrificial gate structures 213a, 213b and 213c are higher than top surfaces of other portions of the ILD structure 222 that are between the sacrificial gate structures 213a, 213b and 213c.

Figure 12:
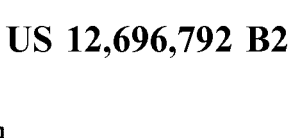

Referring to FIG. 12, in operation 13, the protecting structure is formed. In some embodiments, operation 13 includes further operations. For example, in some embodiments, a patterned mask, such as a patterned photoresist 223 is formed over the first ILD layer 222. As shown in FIG. 12, the patterned mask 223 includes openings respectively exposing a portion of the ILD structure (i.e., the first ILD layer 222) between the sacrificial gate structures 213a, 213b and 213c.

Figure 13:
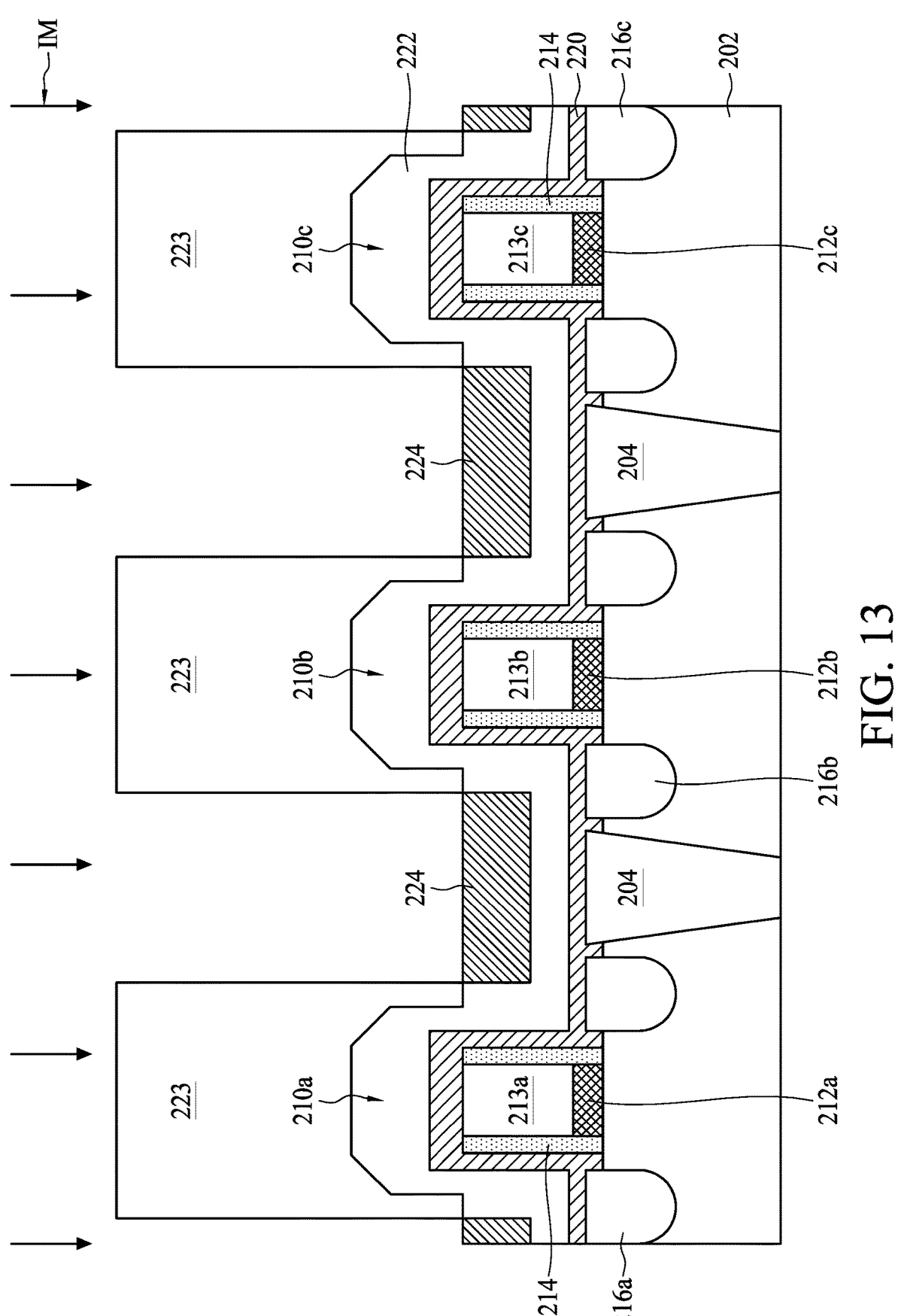

Referring to FIG. 13, in ion implantation IM is performed in operation 13. In some embodiments, the ion implantation implants nitrogen (N) into the portions of the first ILD layer 222 exposed through the openings of the patterned mask 223. Consequently, a doped region 224 is formed in the first ILD layer 222 respectively through the openings of the patterned mask 223. In some embodiments, a depth of the doped region 224 is less than a thickness of the first ILD layer 222. In some embodiments, the depth of the doped region 224 is greater than a half of a height of the sacrificial gate structures 213a, 213b and 213c, but the disclosure is not limited thereto. In some embodiments, a concentration of the nitrogen in the doped region 224 is between approximately $1.0E14$ atom/cm$^3$ and approximately $1.0E16$ atom/cm$^3$, but the disclosure is not limited thereto. After the forming of the doped regions 224, the patterned mask 223 is removed.

Figure 14:
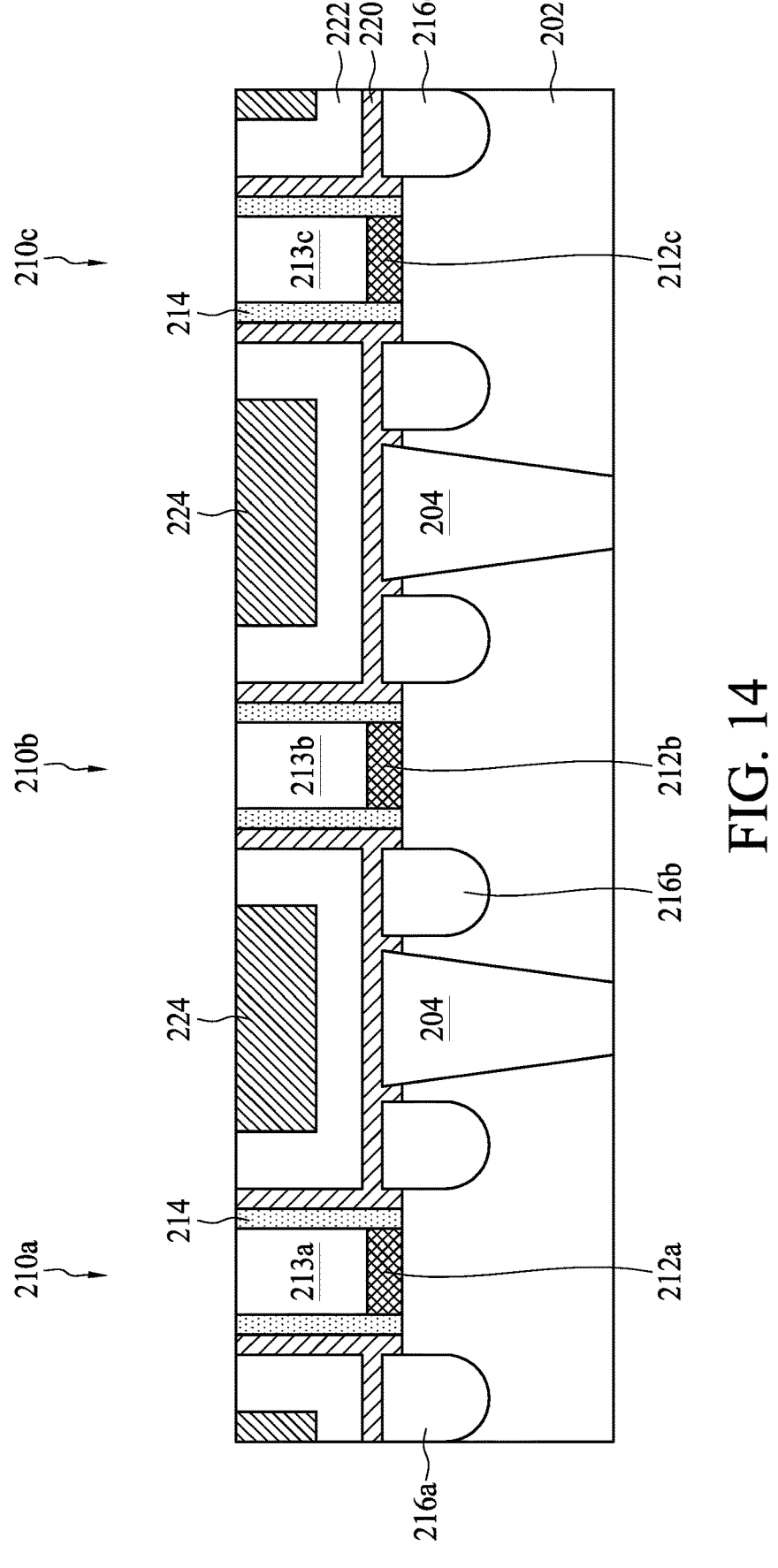

Referring to FIG. 14, in operation 14, a portion of the ILD structure 222 is removed, and in operation 15, top surfaces of the sacrificial gate structure 213a, 213b and 213c are exposed. In some embodiments, a planarization is performed on the ILD structure 222. For example, a CMP operation is performed on the ILD structure 222. A portion of the ILD structure 222 is removed until the top surfaces of the sacrificial gate structures 213a, 213b and 213c are exposed. It should be noted that during the CMP operation, the doped regions 224 have a removing rate lower than that of the ILD structure 222, therefore the dishing issue is mitigated. As shown in FIG. 14, top surfaces of the doped regions 224, top surfaces of the ILD structure 222 and top surfaces of the sacrificial gate structures 213a, 213b and 213c are substantially aligned with each other.

Figure 15:
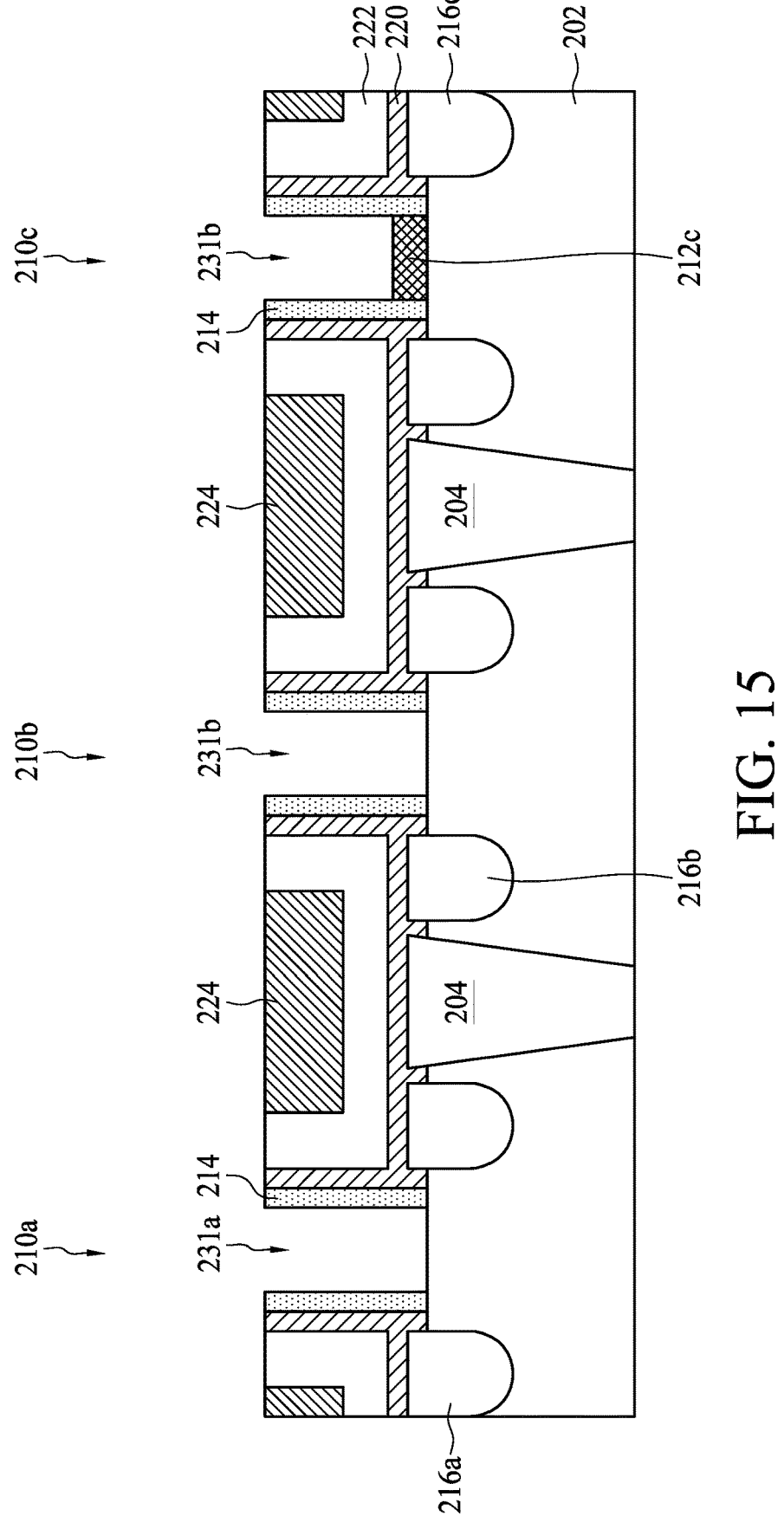

Referring to FIG. 15, in operation 16, the sacrificial gate structures 213a, 213b and 213c are replaced with metal gate structures. In some embodiments, operation 16 includes further operations. For example, the sacrificial gate structures 213a, 213b and 213c are removed. Accordingly, a plurality of gate trenches 231a, 231b and 231c are formed as shown in FIG. 15.

As mentioned above. In some embodiments, the dielectric layers 212a and 212b of the FET devices 210a and 210b, which may be a part of a core circuit, are removed, thus the semiconductor substrate 202 may be exposed through bottoms of the gate trenches 230a and 231b. In some embodiments, the dielectric layer 212c of the FET device 210c, which may a HV device, remains, thus the dielectric layer 212c is exposed through a bottom of the gate trench 231c.

In some embodiments, in operation 16, a high-k dielectric layer is formed. The high-k dielectric layer is formed to cover bottoms and sidewalls of the gate trenches 231a, 231b and 231c. In some embodiments, another dielectric layer serving as an interfacial layer (IL) 232a and 232b may be formed in the bottoms of the gate trenches 231a and 231b before the forming of the high-k dielectric layer. Thus the high-k dielectric layer is formed over the IL 232a in the gate trench 231a, over the IL 232b in the gate trench, and over the dielectric layer 212c in the gate trench 231c.

In some embodiments, in operation 16, a work function metal layer 236a is formed in the gate trench 231a, a work function metal layer 236b is formed in the gate trench 231b, and a work function metal layer 236c is formed in the gate trench 231c. In some embodiments, the work function metal layer 236a include n-type work function metal, while the work function meal layers 236b and 236c include p-type work function metals, depending on the product requirements. In some embodiments, the work function metal layers 236a, 236b and 236c may include a single layer. In some alternative embodiments, the work function metal layers 236a, 236b and 236c may include a multilayered structure.

Figure 16:
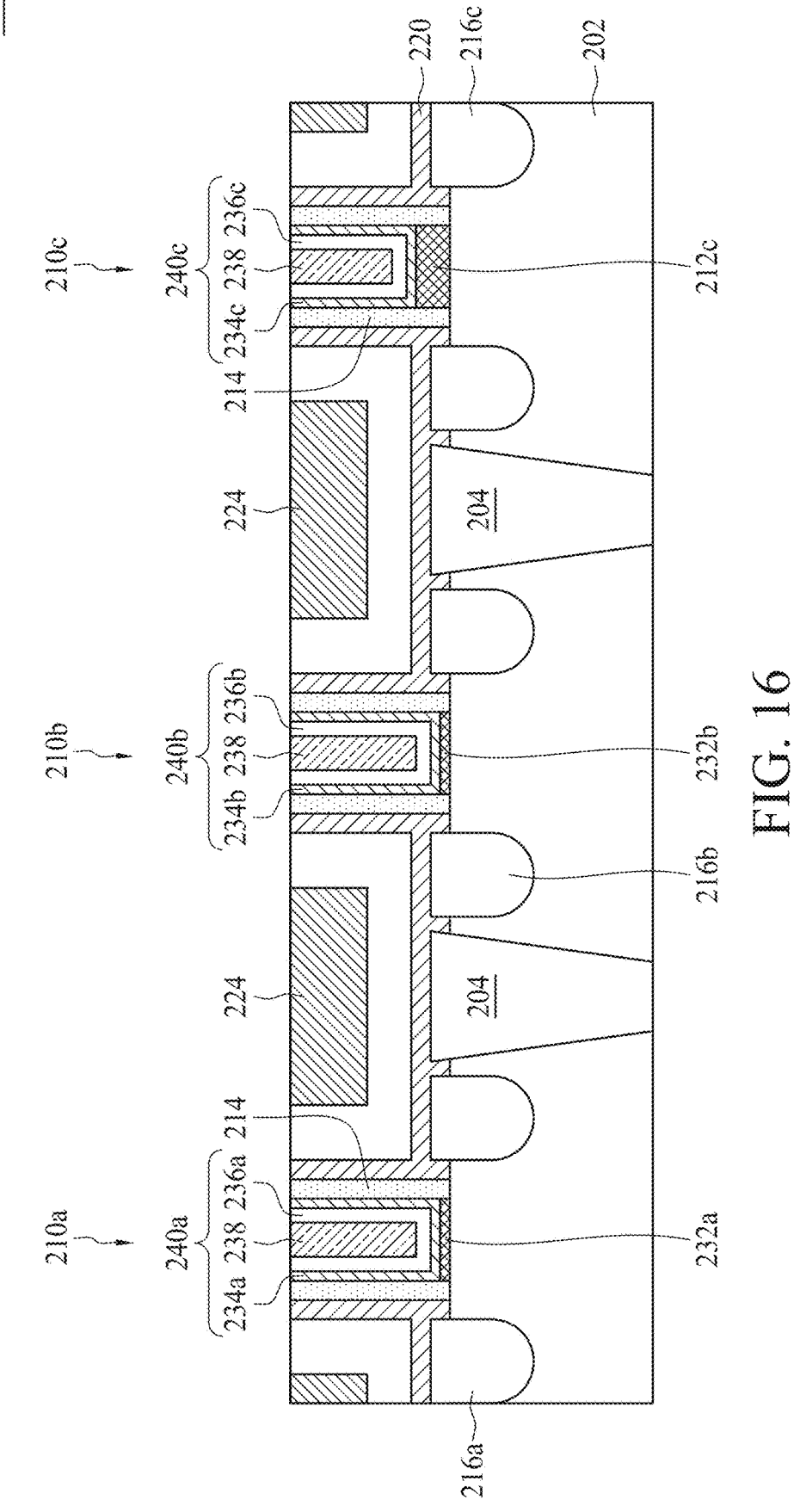

In operation 16, a gap-filling metal layer 238 is formed to fill the gate trenches 231a, 231b and 231c. In some embodiments, the gap-filling metal layer 238 can include conductive material such as Al, Cu, AlCu, or W, but is not limited to such materials. A planarization operation such as a CMP may be performed to remove superfluous layers. Thus, metal gate structures 240a, 240b and 240c are formed. As shown in FIG. 16, the metal gate structure 240a includes the high-k dielectric layer 234a, the work function metal layer 236a and the gap-filling metal layer 238. The metal gate structure 240b includes the high-k dielectric layer 234b, the work function metal layer 236b and the gap-filling metal layer 238. The metal gate structure 240c includes the high-k dielectric layer 234c, the work function metal layer 236c and the gap-filling metal layer 238.

Accordingly, a semiconductor structure 200 is obtained as shown in FIG. 16. The semiconductor structure 200 includes the semiconductor substrate 202 and the FET devices 210a, 210b and 210c disposed over the semiconductor substrate 202. The FET device 210a includes the metal gate structure 240a, the spacer 214 and the source/drain 216a. The FET device 210b includes the metal gate structure 240b, the spacer 214 and the source/drain 216b. The FET device 210c includes the metal gate structure 240c, the spacer 214 and the source/drain 216c. The semiconductor structure 200 further includes an ILD structure 222 over the semiconductor substrate 202 and surrounding the metal gate structures 240a, 240b and 240c. Further, the semiconductor structure 200 includes the protecting structure (i.e., the doped region 224) over the ILD structure 222. As shown in FIG. 16, a top surface of the doped region 224 is aligned with top surfaces of the metal gate structures 240a, 240b and 240c.

The protecting structure (i.e., the doped region 224) helps mitigate the dishing issue occurred in the CMP operation. Thus, the yield of the CMP operation is improved.

Figure 17:
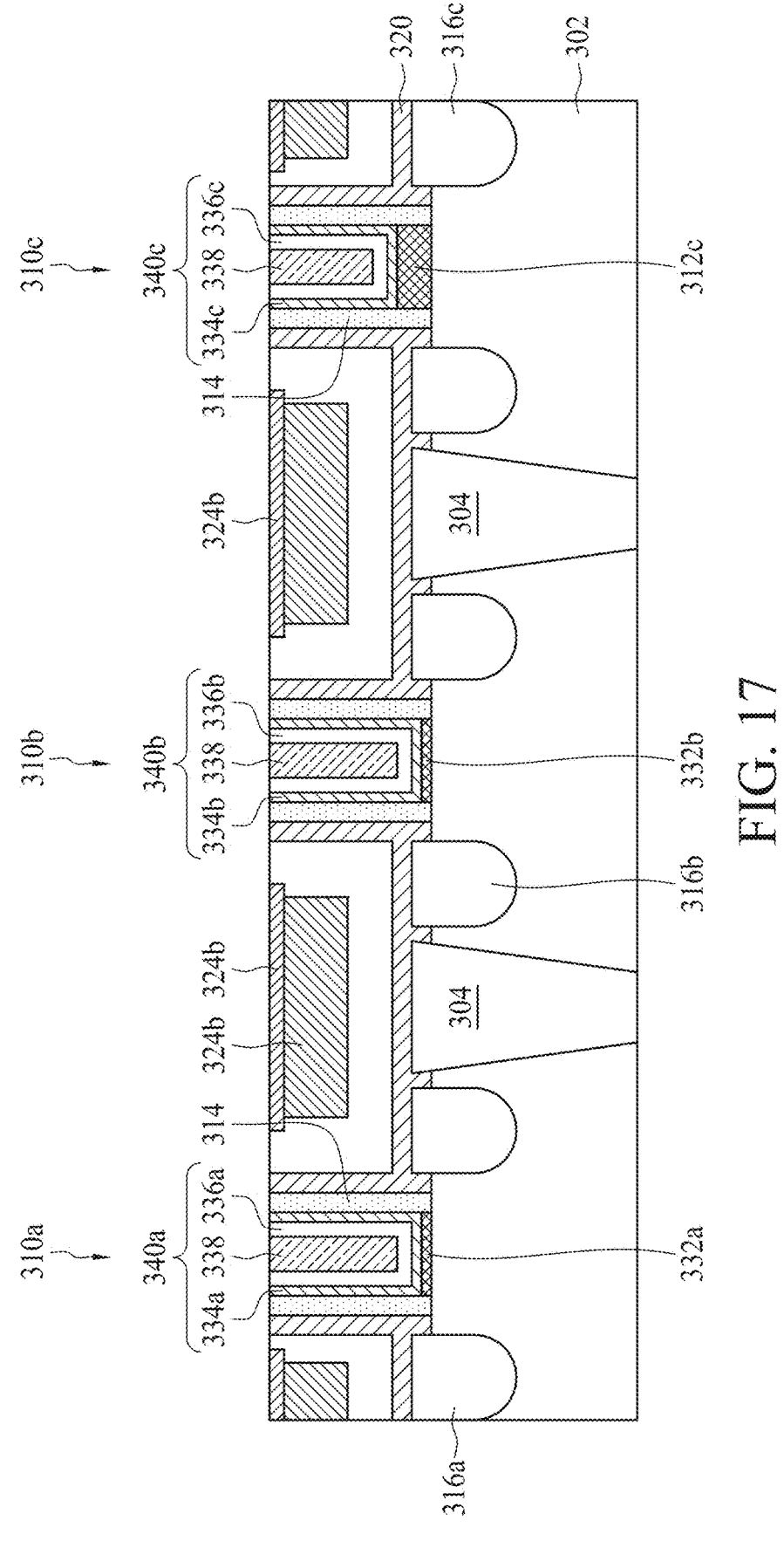
FIG. 17 is a cross-sectional view illustrating a semiconductor structure according to aspects of the present disclosure in one or more embodiments.

Please refer to FIG. 17, which is a cross-sectional view of a semiconductor structure 300 according to aspects of the present disclosure in one or more embodiments. The semiconductor structure 300 may be formed by the method 10, but the disclosure is not limited thereto. As shown in FIG. 17, the semiconductor structure 300 includes the semiconductor substrate 302 and the FET devices 310a, 310b and 310c disposed over the semiconductor substrate 302. The FET device 310a includes the metal gate structure 340a, the spacer 314 and the source/drain 316a. The metal gate structure 340a includes a high-k dielectric layer 334a, a work function metal layer 336a and a gap-filling metal layer

11

338. The FET device 310b includes the metal gate structure 340b, the spacer 314 and the source/drain 316b. The metal gate structure 340b includes a high-k dielectric layer 334b, a work function metal layer 336b and a gap-filling metal layer 338. The FET device 310c includes the metal gate structure 340c, the spacer 314 and the source/drain 316c. The metal gate structure 340c includes a high-k dielectric layer 334c, a work function metal layer 336c and a gap-filling metal layer 338. The semiconductor structure 300 further includes an ILD structure 322 over the semiconductor substrate 302 and surrounding the metal gate structures 340a, 340b and 340c. Further, the semiconductor structure 300 includes the protecting structure over the ILD structure 222. In such embodiments, the protecting structure of the semiconductor structure 300 may include both the protecting layer 324a and the doped region 324b.

In summary, the present disclosure provides semiconductor structure including protecting structure and a method for forming the same. The semiconductor structure can be formed in a planar device process according to some embodiments. The semiconductor structure can be formed in a non-planar device in alternative embodiments. In some embodiments, the method for forming the semiconductor structure includes providing a protecting layer over a top surface of the dielectric structure, which fills spaces between the sacrificial gate structures. In other embodiments, the method for forming the semiconductor structure includes providing a doped region in the dielectric structure. The protecting layer and the doped region both help reducing consumption of the dielectric structure. Accordingly, the dishing issue during a planarization required in the HKMG process, and the yield of the planarization is improved.

Some embodiments of the present disclosure provide a semiconductor structure. The semiconductor structure includes a semiconductor substrate, a metal gate structure disposed over the semiconductor substrate, an ILD structure over the semiconductor substrate and surrounding the metal gate structure, and a protecting layer over the ILD structure. A top surface of the protecting layer is aligned with a top surface of the metal gate structure. The protecting layer is separated from the metal gate structure.

Some embodiments of the present disclosure provide a semiconductor structure. The semiconductor structure includes a semiconductor substrate, a metal gate structure disposed over the semiconductor substrate, an ILD structure over semiconductor substrate and surrounding the metal gate structure, and a doped region in the ILD structure.

Some embodiments of the present disclosure provide a method for forming a semiconductor structure. The method includes following operations. A plurality of FET devices are formed over a semiconductor substrate. Each of the FET devices includes a sacrificial gate structure. An ILD structure is formed over the semiconductor substrate and surrounding the FET devices. A protecting structure is formed in the ILD structure. A portion of the ILD structure is removed. A top surface of the sacrificial gate structure is exposed. The sacrificial gate structure is replaced with a metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure comprising:

forming a plurality of field-effect transistor (FET) devices over a semiconductor substrate, wherein each of the FET devices comprises a sacrificial gate structure;

forming an etch stop layer over the substrate and the FET devices, wherein the etch stop layer covers top surfaces of the sacrificial gate structures;

forming an inter-layer (ILD) structure over the etch stop layer and the substrate and surrounding the FET devices, and covering the top surfaces of the sacrificial gate structures;

forming a protecting structure in the ILD structure after the forming of the ILD structure;

removing portions of the ILD structure and portions of the etch stop layer to expose the top surfaces of the sacrificial gate structures, wherein a top surface of the etch stop layer, a top surface of the ILD structure, a top surface of the protecting structure and the top surfaces of the sacrificial gate structures are aligned with each other;

removing the sacrificial gate structures to form gate trenches after the forming of the protecting structure and the removing of the portion of the ILD structure; and forming a metal gate structure in each of the gate trenches;

wherein the removing of the portions of the ILD structure and the portions of the etch stop layer comprises:

performing a chemical-mechanical polishing (CMP) operation, wherein a removing rate of the protecting structure is lower than a removing rate of the ILD structure in the CMP operation.

2. The method of claim 1, wherein the gate trenches are offset from the protecting structure.

3. The method of claim 1, wherein the forming of the metal gate structure further comprising:

forming a work function metal layer in the gate trenches;

filling the gate trenches with a gap-filling metal layer; and removing superfluous gap-filling metal layer and work function metal layer.

4. A method for forming a semiconductor structure comprising: forming a plurality of FET devices over a semiconductor substrate, wherein each of the FET devices comprises a sacrificial gate structure and a source/drain;

forming an etch stop layer over the substrate and the FET devices, wherein the etch stop layer covers top surfaces of the sacrificial gate structures and top surfaces of the sources/drains;

forming an ILD structure over the etch stop layer, the substrate and the FET devices;

forming a doped region in the ILD structure between the sacrificial gate structures of adjacent two FET devices, wherein a bottom and a sidewall of the doped region are in contact with the ILD structure, and the doped region is separated from the sources/drains of the FET devices by the ILD structure and the etch stop layer;

removing portions of the ILD structure and portions of the etch stop layer;

exposing the top surfaces of the sacrificial gate structures, wherein a top surface of the etch stop layer, a top surface of the ILD structure, a top surface of the doped region and the top surfaces of the sacrificial gate structures are aligned with each other; and replacing the sacrificial gate structures with metal gate structures;

wherein the removing of the portions of the ILD structure and the portions of the etch stop layer comprises a CMP operation, and a removing rate of the doped region is lower than a removing rate of the ILD structure in the CMP operation.

5. The method of claim 4, wherein the forming of the doped region comprises:

forming a patterned mask over the ILD structure, wherein the patterned mask comprises an opening exposing a portion of the ILD structure between the adjacent two sacrificial gate structures; and performing an ion implantation to the portion of the ILD structure to form the doped region through the opening.

6. The method of claim 5, wherein a width of the patterned mask is greater than a width of each sacrificial gate structure.

7. The method of claim 5, wherein the patterned mask comprises a patterned photoresist.

8. The method of claim 5, wherein the ion implantation comprises nitrogen.

9. The method of claim 8, wherein a concentration of the nitrogen in the doped region is between approximately $1.0E14$ atom/cm$^3$ and approximately $1.0E16$ atom/cm$^3$.

10. The method of claim 4, wherein a depth of the doped region is less than a thickness of the ILD structure.

11. The method of claim 10, wherein the depth of the doped region is greater than a half of heights of the sacrificial gate structures.

12. The method of claim 4, wherein the ILD structure is conformally formed over the substrate and the FET devices.

13. The method of claim 12, wherein the ILD structure comprises first portions over the sacrificial gate structures and second portions between the first portions, and top surfaces are at a level different from that of top surfaces of the second portions.

14. The method of claim 4, wherein the doped region comprises a dielectric material same as that of the ILD structure.

15. A method for forming a semiconductor structure comprising:

forming a FET device over a semiconductor substrate, wherein the FET device comprises a sacrificial gate structure and a source/drain;

forming an etch stop layer over a top surface of the sacrificial gate structure and a top surface of the source/drain;

forming an ILD structure over the etch stop layer, the substrate and the FET device;

forming a patterned mask over the ILD structure, wherein the patterned mask overlaps the sacrificial gate structure;

performing an ion implantation to form an nitrogen (N)-doped region in the ILD structure after the forming of the patterned mask, wherein the N-doped region is offset from the sacrificial gate structure and the N-doped region is separated from the source/drain of the FET device by the ILD structure;

removing a portion of the ILD structure, a portion of the etch stop layer and a portion of the N-doped region;

exposing the top surface of the sacrificial gate structure, wherein a top surface of the etch stop layer, a top surface of the ILD structure, a top surface of the N-doped region and the top surface of the sacrificial gate structure are aligned with each other;

removing the sacrificial gate structure to form a gate trench; and forming a metal gate structure in the gate trench;

wherein a concentration of the nitrogen in the N-doped region is between approximately $1.0E14$ atom/cm3 and approximately $1.0E16$ atom/cm3;

further comprises a spacer disposed between the metal gate structure and the ILD structure, wherein sidewalls of the N-doped region are separated from the spacer by the ILD structure;

wherein the N-doped region is separated from the CESL by the ILD structure wherein the N-doped region comprises a dielectric material same as that of the ILD structure.

* * * * *